United States Patent [19]
Yamashita

[11] Patent Number: 5,590,137
[45] Date of Patent: Dec. 31, 1996

[54] SEMICONDUCTOR IC TESTER

[75] Inventor: Kazuhiro Yamashita, Kazo, Japan

[73] Assignee: Advantest Corporation, Tokyo, Japan

[21] Appl. No.: 322,270

[22] Filed: Oct. 13, 1994

[30] Foreign Application Priority Data

Oct. 13, 1993  [JP]  Japan ................... 5-255532

[51] Int. Cl.$^6$ .................................. G01R 31/28
[52] U.S. Cl. .................. 371/27; 371/25.1; 371/20.4; 324/158.1
[58] Field of Search .................. 371/25, 25.1, 27, 371/24, 22.3, 21.2; 324/73 R, 73.1, 158 R, 158.1; 395/183.08

[56] References Cited

U.S. PATENT DOCUMENTS

| | | | |
|---|---|---|---|
| 4,497,056 | 1/1985 | Sugamori | 371/25 |
| 4,928,278 | 5/1990 | Otsuji et al. | 371/1 |
| 5,172,047 | 12/1992 | Funakura | 324/158 R |
| 5,430,737 | 7/1995 | Yamashita et al. | 371/25.1 |

*Primary Examiner*—Robert W. Beausoliel, Jr.
*Assistant Examiner*—Nadeem Iqbal
*Attorney, Agent, or Firm*—Knobbe, Martens, Olson & Bear

[57] ABSTRACT

A semiconductor IC tester is capable of undertaking a double-speed test for a IC device under test wherein the test pattern application and resulted signal comparison are performed both in the first half and the latter half of a test cycle of the IC tester without sacrificing the number of test pins. In the double-speed mode, the generating speed of test patterns is doubled as follows. In the first half of the test cycle, a flip-flop is set or reset at the timings of the outputs of first and second delay circuits, respectively. Moreover, in the latter half of test cycle, the flip-flop is set or reset at the timings of the output of third and fourth delay circuits, respectively, which are used usually as enabling and disabling a driver which generates a final form of test signal to the device under test. Threshold voltage values for first and second comparators are set to the same value, the compared result in the first half of test cycle is taken from the first comparator, and the compared result in the latter half is taken from the second comparator. The double-speed test may be applied to IC devices having input-only pins and output-only pins.

10 Claims, 11 Drawing Sheets

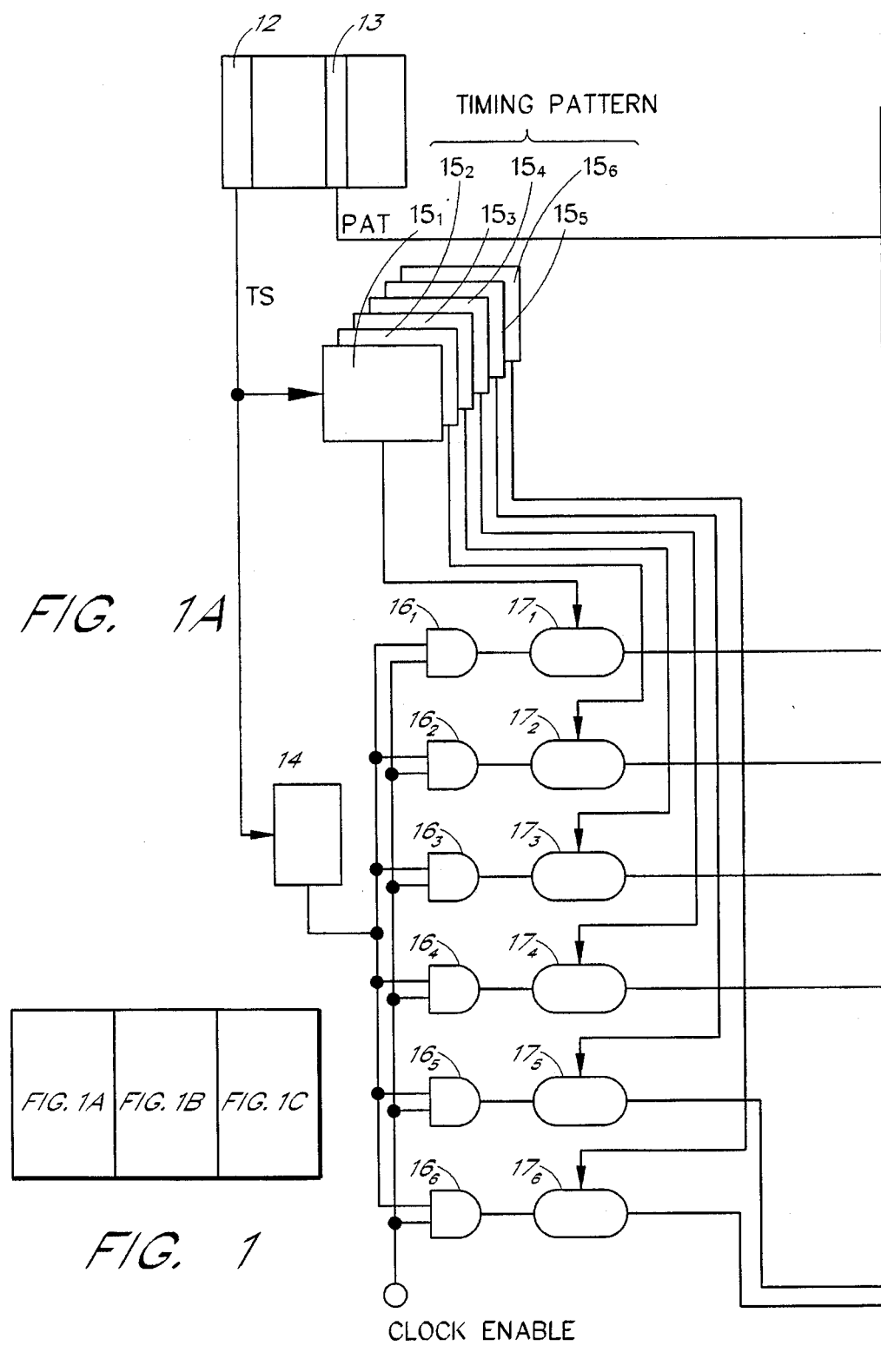

| ADDRESS | EXPECTED DATA IN THE FIRST HALF | EXPECTED DATE IN THE LATTER HALF | EXH | EXHZ | EXL | EXLZ | CPEI | CPE2 |
|---|---|---|---|---|---|---|---|---|
| L | L | X | 0 | 1 | 1 | 0 | 1 | 0 |
| L | X | L | 0 | 1 | 1 | 0 | 0 | 1 |
| L | L | L | 0 | 1 | 1 | 0 | 1 | 1 |
| H | H | X | 1 | 0 | 0 | 1 | 1 | 0 |
| H | X | H | 1 | 0 | 0 | 1 | 0 | 1 |
| H | H | H | 1 | 0 | 0 | 1 | 1 | 1 |
| Z | L | H | 0 | 1 | 0 | 1 | 1 | 1 |
| X | H | L | 1 | 0 | 1 | 0 | 1 | 1 |

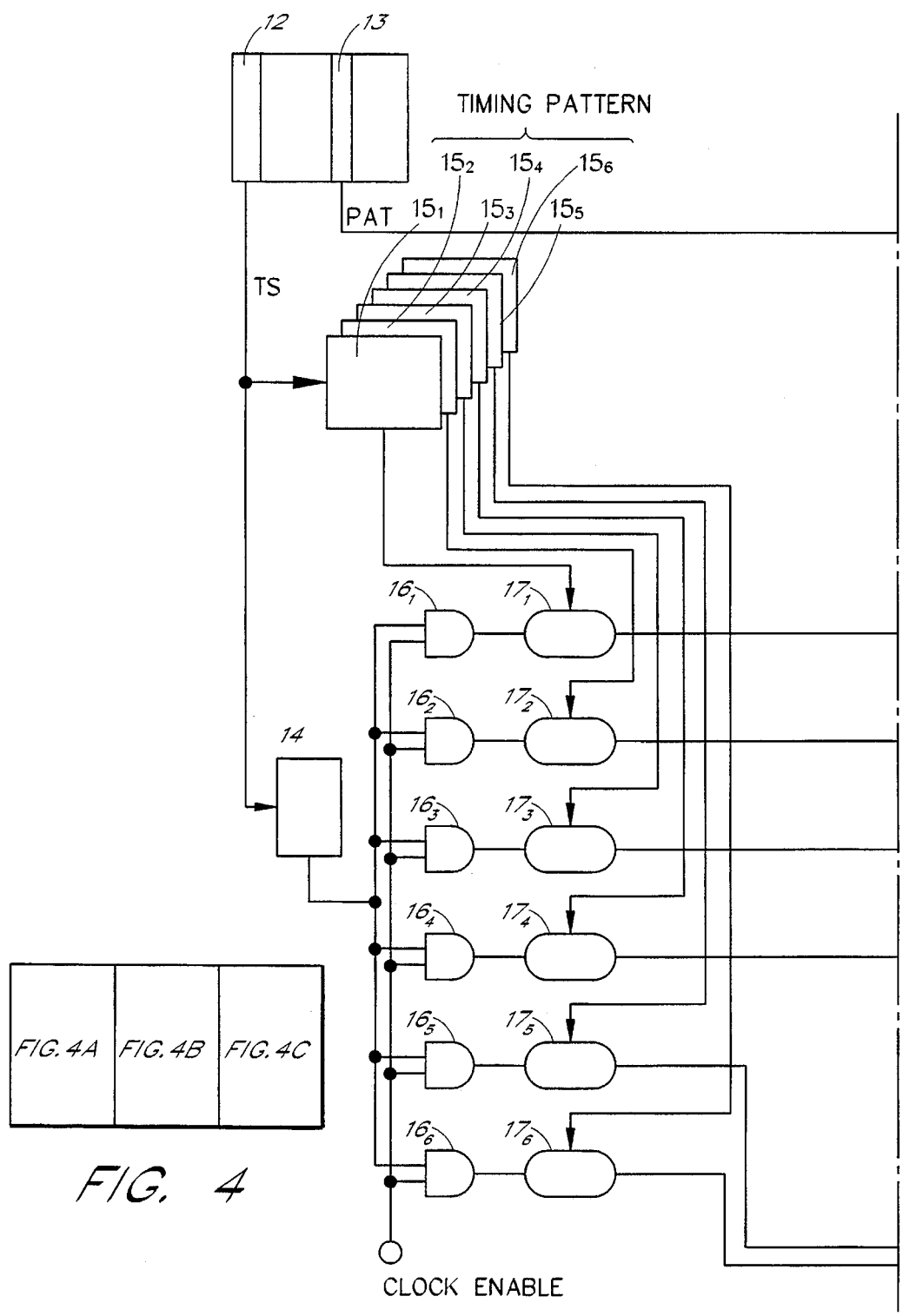

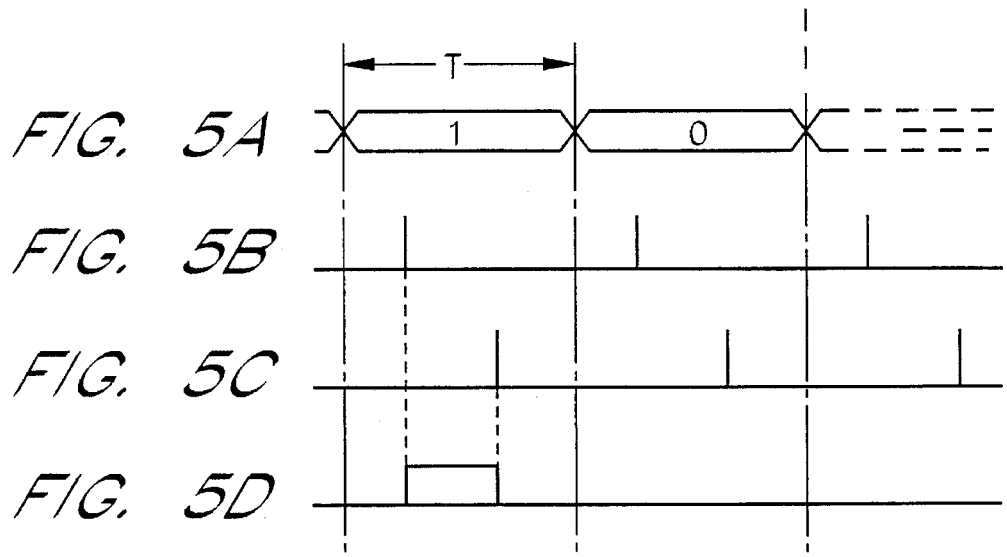
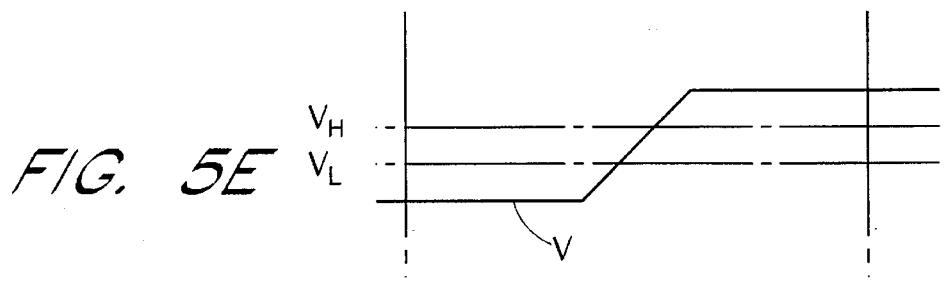

A
SEMICONDUCTOR IC TESTER

FIELD OF THE INVENTION

The present invention relates to a semiconductor IC tester that tests a semiconductor IC device by applying test patterns to the IC device and comparing the output of the IC device with expected data. More particularly, the invention relates to an improved circuit structure in a semiconductor IC tester by which tests for an IC device can be performed at double speed of a test cycle.

BACKGROUND OF THE INVENTION

FIG. 4 shows a block diagram of a prior art semiconductor IC tester. Timing data TS and pattern data PAT are read, respectively, from a timing part 12 and a pattern part 13 of a pattern generator 11 every test cycle. The timing data TS consisting of 10 bits for instance is supplied to a rate generator 14 and timing memories $15_1$–$15_6$. A reference timing signal at the test cycle corresponding to the timing data TS is generated from the rate generator 14 and is supplied to delay circuits $17_1$–$17_6$ via gates $16_1$–$16_6$. Moreover, the timing data TS is used as an address of timing memories $15_1$–$15_6$ and the delay data are read therefrom to set delay times in the delay circuits $17_1$–$17_6$. Timings in the test cycle are decided depending on the amount of the delay times in the delay circuits $17_1$–$17_6$.

The reference timing signal thus delayed in these delay circuits $17_1$–$17_6$ becomes six different clocks, i.e., the first to sixth clocks. The first clock is supplied to two AND circuits $18_1$ and $18_2$. The second clock is supplied to two AND circuits $18_3$ and $18_4$. The third clock is supplied to three AND circuits $18_5$, $18_6$, and $18_7$. The fourth clock is supplied to an AND circuit $18_8$. The fifth and sixth clocks are provided to comparators as strobe signals.

The contents of a waveform memory 19 are read by using the pattern data PAT as an address. The data are read from the first section to the eighth section of the waveform memory 19. These sections are represented by 0, 1, N, P, L, H, Z, and X in FIG. 4. One of the sections is specified by the three bits A, B, and C of the pattern data PAT. The first drive-high data T1S, the first drive-low data T1R, the second drive-high data T2S, the second drive-low data T2R, the third drive-high data T3S, the third drive-low data T3R, driver enable data T3L, driver disable data T4T, expected-high data EXH, and expected-low data EXL are respectively read from the specified section in the waveform memory 19.

The contents of the waveform memory 19 vary as waveforms generated are different, like NRZ (nonreturn to zero) waveform, NRZI (nonreturn to zero inverted) waveform, RZ (return to zero) waveform, RZI (return to zero inverted) waveform, XOR (exclusive OR) waveform, XORI (exclusive OR inverted) waveform, and etc. That is, a desired waveform is generated corresponding to the contents in the waveform memory 19.

Each output of the AND circuits $18_1$, $18_3$ and $18_5$ is supplied to a set terminal S of a first flip-flop 22 via an OR circuit 21. Each output of the AND circuits $18_2$, $18_4$ and $18_6$ is supplied to a reset terminal R of the first flip-flop 22 via an OR circuit 23. The output of the first flip-flop 22 is connected to an I/O pin of a device under test 26 through a driver 24 and a test pin $25_i$ of the IC tester. In this example, the I/O pin of the IC device under test 26 functions both an input pin and an output pin, as is well known in the art. The output of the AND circuit $18_7$ is supplied to a set terminal S of a second flip-flop 77, and the output of the AND circuit $18_8$ is supplied to a reset terminal R of the second flip-flop 77. The output of the second flip-flop 77 is supplied to an enable control terminal of the driver 24.

The test pin $25_i$ is also connected to an inverting input of a first comparator 27 and a non-inverting input of a second comparator 28. An output voltage of the device under test 26 through the test pin $25_i$ is compared with a high threshold voltage $V_H$ and a low voltage threshold $V_L$ by the comparator 27 and 28, respectively. These compared results are sampled in the first and second comparators 27 and 28 by the strobes formed of the fifth and sixth clocks from the delay circuits $17_5$ and $17_6$. The outputs of the first and second comparators 27 and 28 are ANDed with the expected-high data EXH and the expected-low data EXL derived from the waveform memory 19 at AND circuits 31 and 32, respectively. The outputs of the first and second comparators 27 and 28 are also supplied to an OR circuit 33, and the output of the OR circuit 33 is ANDed with the expected-high data EXH and the expected-low data EXL at an AND circuit 34. Finally, the outputs of the AND circuits 31, 32, and 34 are supplied to an OR circuit 35.

In the case of applying the RZ waveform to the device under test 26, the contents of the waveform memory 19 are arranged as shown in FIG. 4. Three bits (PATA, PATB, PATC) of the pattern data from the pattern generator 11 are used as an address of the waveform memory 19. The least significant bit PATA mainly decides a waveform data. That is, when the PATA is logic 1, the waveform data is logic 1, and when the PATA is logic 0, the waveform data is logic 0. The I/O switch of an I/O pin is determined by the most significant bit PATC in the pattern data. That is, when a specific test pin of the device under test is used as an output pin (compare cycle), the PATC is logic 1, and otherwise logic 0. In the case of the compare cycle, expected data are determined by two bits of PATA and PATB as follows. The expected data is low L when PATA is 0 and PATB is 0. The expected data is high H when the PATA is 1 and the PATB is 0. The expected data is high impedance Z when the PATA is 0 and the PATB is 1. The expected data is "don't care X" when the PATA is 1 and the PATB is 1.

In the example of data arrangement in the waveform memory 19 shown in FIG. 4, and when the PATA of the pattern data is 1 and 0 as shown in FIG. 5A, the test signals are generated as follows. In either situation of the pattern data 1 or 0, the driver enable data T3L read from the waveform memory 19 is 1. The second flip-flop 77 is set beforehand through the AND circuit $18_7$ according to the timing of the clock from the delay circuit $17_3$. As a result, the driver 24 is enabled. When the PATA is 1, the first drive-high data T1S, which is 1, is read and the first flip-flop 22 is set by the T1S by the timing of the clock from the delay circuit $17_1$ as shown in FIG. 5B. Moreover, the second drive-low data T2R, which is also 1, is read and the first flip-flop 22 is reset by the timing of the clock from the delay circuit $17_3$ as shown in FIG. 5C. As a consequence, the driver 24 is driven by the RZ waveform shown in FIG. 5D and this RZ waveform is applied to an I/O pin of the device under test 26. When the PATA is 0, both T1S and T2R are 0, as shown in the waveform memory 19 of FIG. 4, so the input waveform to the driver 24 maintains a low level as shown in FIG. 5D.

When the I/O pin of the drive under test 26 is used as an output pin, the output impedance of the driver 24 is set to be infinite by resetting the second flip-flop 77 and disabling the driver 24. Under such condition, signals output from the device under test 26 through the I/O pin are supplied to the test pin $25_i$ and are compared in the comparators 27 and 28 with the high threshold voltage $V_H$ and the low threshold voltage $V_L$. The threshold voltages $V_H$ and $V_L$ are selected as shown in FIG. 5E. When the input voltage V is larger than $V_H$, the output of the comparator 27 becomes low and the output of the comparator 28 becomes high. When the input V is smaller than $V_H$ and larger than $V_L$, the output of the comparator 27 becomes high and the output of the comparator 28 becomes also high. When the input V is smaller than $V_L$, the output of the comparator 27 becomes high and the output of the comparator 28 becomes low.

The compared results in the comparators 27 and 29 are sampled by the strobes of the same timing from the delay circuits $17_5$ and $17_6$, and ANDed with expected-high data EXH and expected-low data EXL read from the waveform memory 19 by the AND circuits 31 and 32. When the expected data is low, expected-low data EXL from the waveform memory 19 is 1. When the expected data is high, expected-high data EXH from the waveform memory is 1. When the expected data is high impedance output Z, EXL and EXH are both 1. When the expected data is "don't care X", EXL and EXH are both 0. As a result, when the expected data is high and the input V is smaller than threshold $V_H$, the output of the AND circuit 31 becomes high level showing a failure of the output of the device under test 26. When the expected data is low and the input V is larger than $V_L$, the output of the AND circuit 32 becomes high level showing a failure of the output of the device under test 26. When the expected data is high impedance and the input V is not in a high impedance state, the output of the AND circuit 34 becomes high level indicating a failure in the output signal of the device under test 26. Failure signals from the AND circuits 31, 32 and 34 are also provided to the OR circuit 35.

The foregoing is a mechanism to apply test patterns to the device under test 26 and to perform a GO/NO-GO decision of the output of the device under test 26 is provided at each test pin of the IC tester. Therefore, the IC tester usually has a large number of circuit configurations as shown in FIG. 4 corresponding to the number of pins for prospective IC devices to be tested. If, for example, the device under test 26 includes a hundred I/O pins, the IC tester must includes at least a hundred circuit configuration shown in FIG. 4 to test all the I/O pins through a process as describe above.

In the conventional IC tester, a test can be performed at a faster speed than the maximum speed of the IC tester by arranging the circuit connection as shown in FIG. 6. In FIG. 6, like parts corresponding to those in FIG. 4 are identified by the same reference numerals. The odd number test pin $25_i$ and an even number pin $25_{i+1}$ adjacent to the odd number pin are connected as follows. The outputs of two OR circuits 21, the outputs of two OR circuits 23, the outputs of two AND circuits 18$_7$, and the outputs of two AND circuits 18$_8$ are connected in parallel. Further, all inputs of comparators 27 and 28 are connected to receive an output signal from the device under test through the I/O pin $25_i$. As shown in FIG. 6, only the odd number test pin $25_i$ is connected to the I/O pin of the device under test 26. The test patterns are applied to the device under test 26 as follows. Clocks and strobes to the odd number test pin $25_i$ are generated in the first half of test cycle T, while clocks and strobes corresponding to the even number test pin $25_{i+1}$ (now not used) are generated in the latter half of test cycle T. Because tests are performed two times in one test cycle T, the double-speed test can be achieved.

In the double-speed test of the conventional structure shown in FIG. 6, only the IC device which has a number of I/O pins equal to or less than a half of the number of test pins installed in the IC tester can be tested. For example, in case where the IC tester has a hundred test pins, an IC device having less than 50 I/O pins can be tested under the double speed testing. That is, only the half number of test pins of the IC tester can be fully used.

SUMMARY OF THE INVENTION

The present invention provides a semiconductor IC tester in which all test pins are effectively used with respect to I/O pins of an IC device under test in a normal speed test or even in a double-speed test.

According to this invention, the first flip-flop is set and reset by an ANDed signal formed of a double-speed mode signal and another ANDed signal formed of a third clock, a fourth clock, enable data, and disable data. The second flip-flop is set and prohibited to be reset by the double-speed mode signal. The first and second comparators are sampled by strobes in the first and latter half of the test cycle. The non-inverted output of the first comparator is ANDed with expected-high data, and the inverted output of the first comparator is also ANDed with expected non-high data. The ORed signal with these outputs is output as test results via the first selector in place of the ANDed signal with the non-inverted output of the first comparator and expected-high data. The non-inverted output of the second comparator is ANDed with expected-low data, and the inverted output of the second comparator is also ANDed with expected non-low data. The ORed signal with these outputs is output as test results via the second selector in place of the ANDed signal with the non-inverted output of the second comparator and expected-low data.

Almost always, high-speed semiconductor IC devices have no I/O pins but have separate input pins and output pins. Moreover, ECL (emitter-coupled logic) circuits are often used in general in high-speed semiconductor IC devices. For the ECL circuit, threshold $V_H$ and $V_L$ may be the same value, and states of high impedance Z in the ECL device need not be detected. Therefore, test pins of the IC tester can be used as output-only test pins or input-only test pins. For output-only test pins, drivers may not be controlled and always be enabled. Therefore, according to the invention, the timing clocks used to control drivers in the prior art are now used to reset a flip-flop to drive drivers.

Therefore, threshold voltage values of the first and second comparators are also set to be the same voltage. While the first comparator is sampled by a strobe in the latter half of test cycle, the second comparator is sampled by a strobe in the latter half of the test cycle.

BRIEF DESCRIPTION OF THE DRAWINGS

FIG. 2 is a graphic view showing waveforms and data in the embodiment of FIG. 1.

FIGS. 5A–5D are timing charts showing an example of relationship between test patterns, timing clocks, and output waveforms in the conventional IC tester. FIG. 5E shows an example of relationship between an input signal and threshold voltage values of comparators.

DETAILED EXPLANATION OF THE INVENTION

Figure 1B:
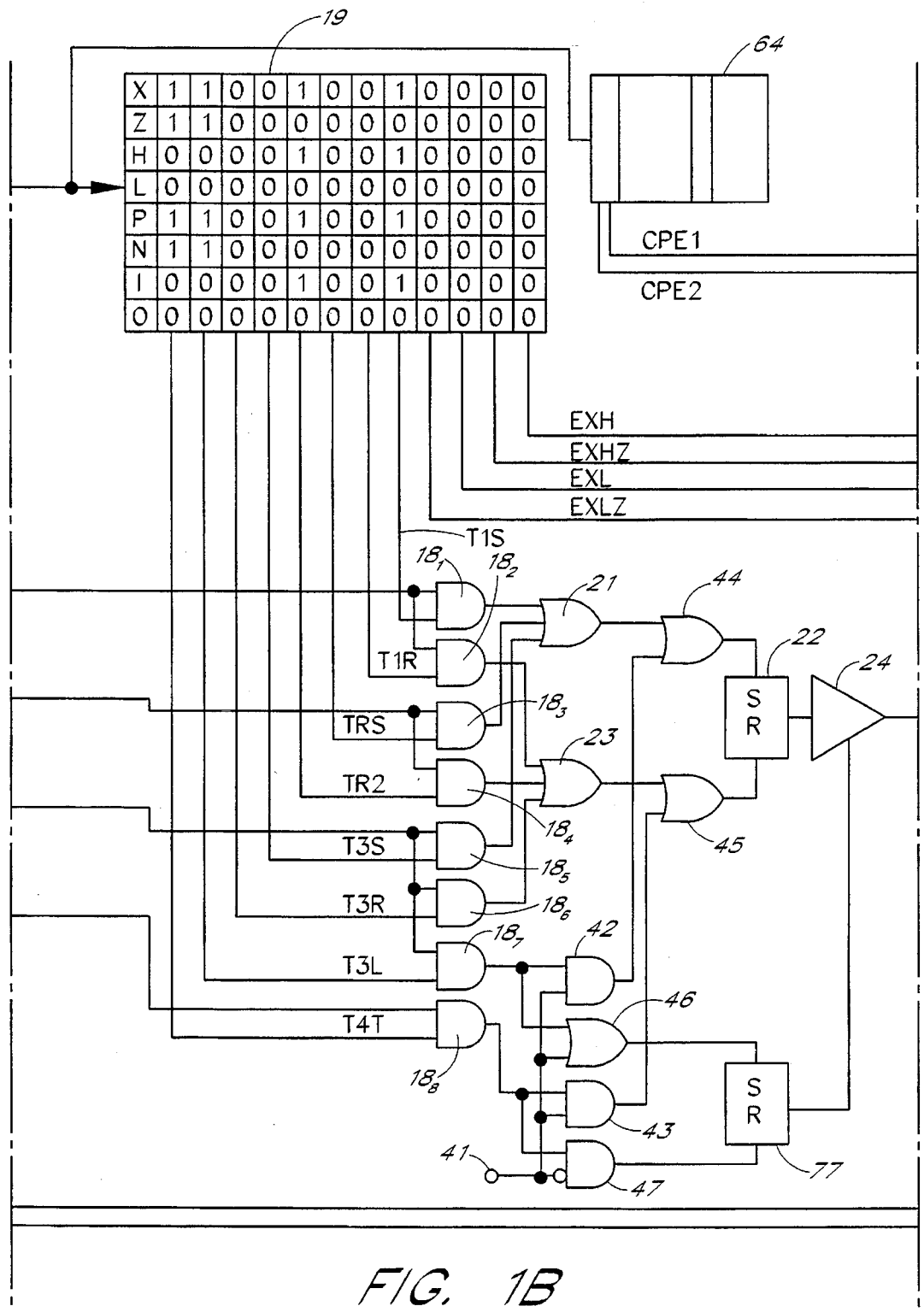
FIG. 1 is a block diagram showing an embodiment of semiconductor IC tester according to the present invention.
Figure 1C:
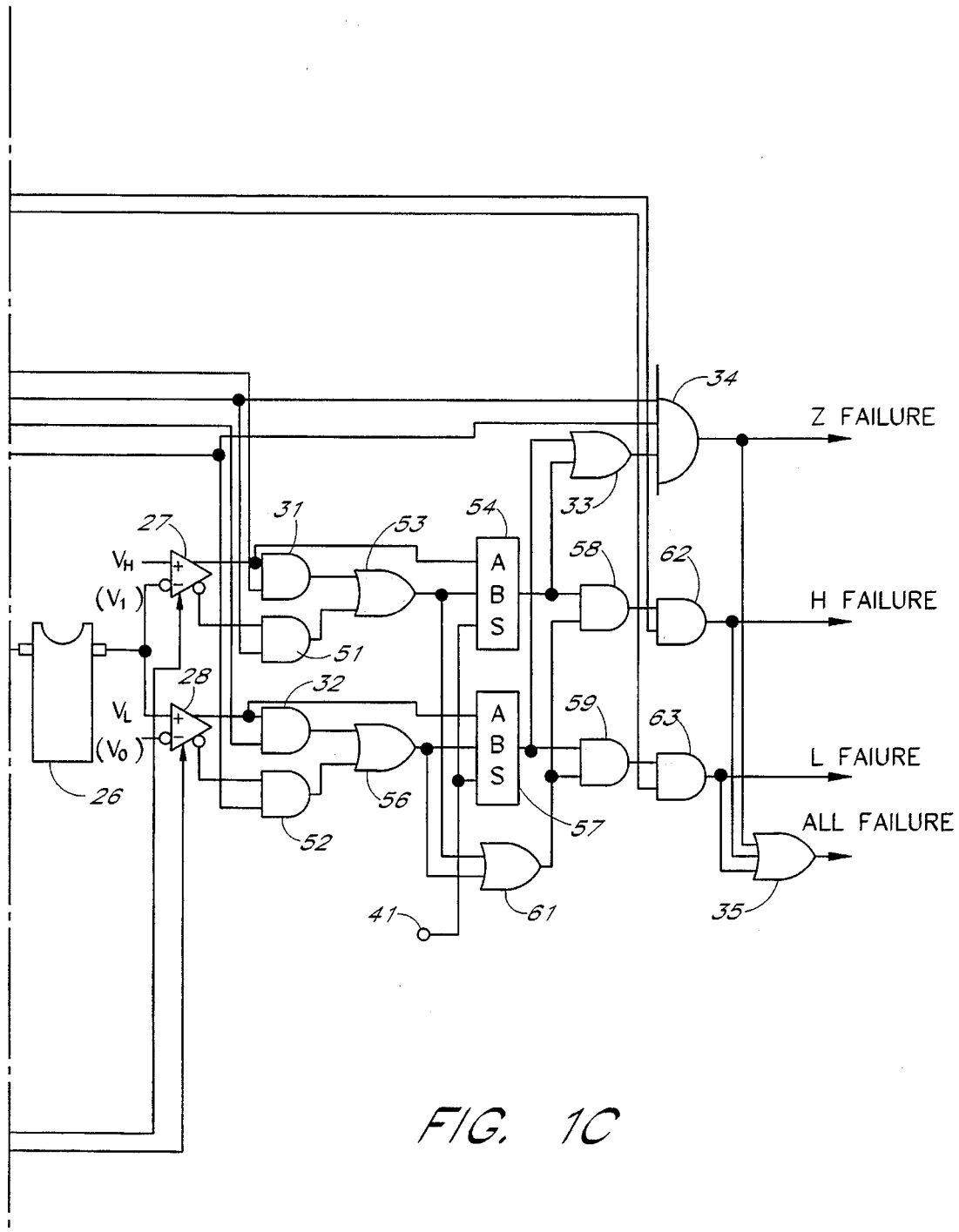
Figure 4B:
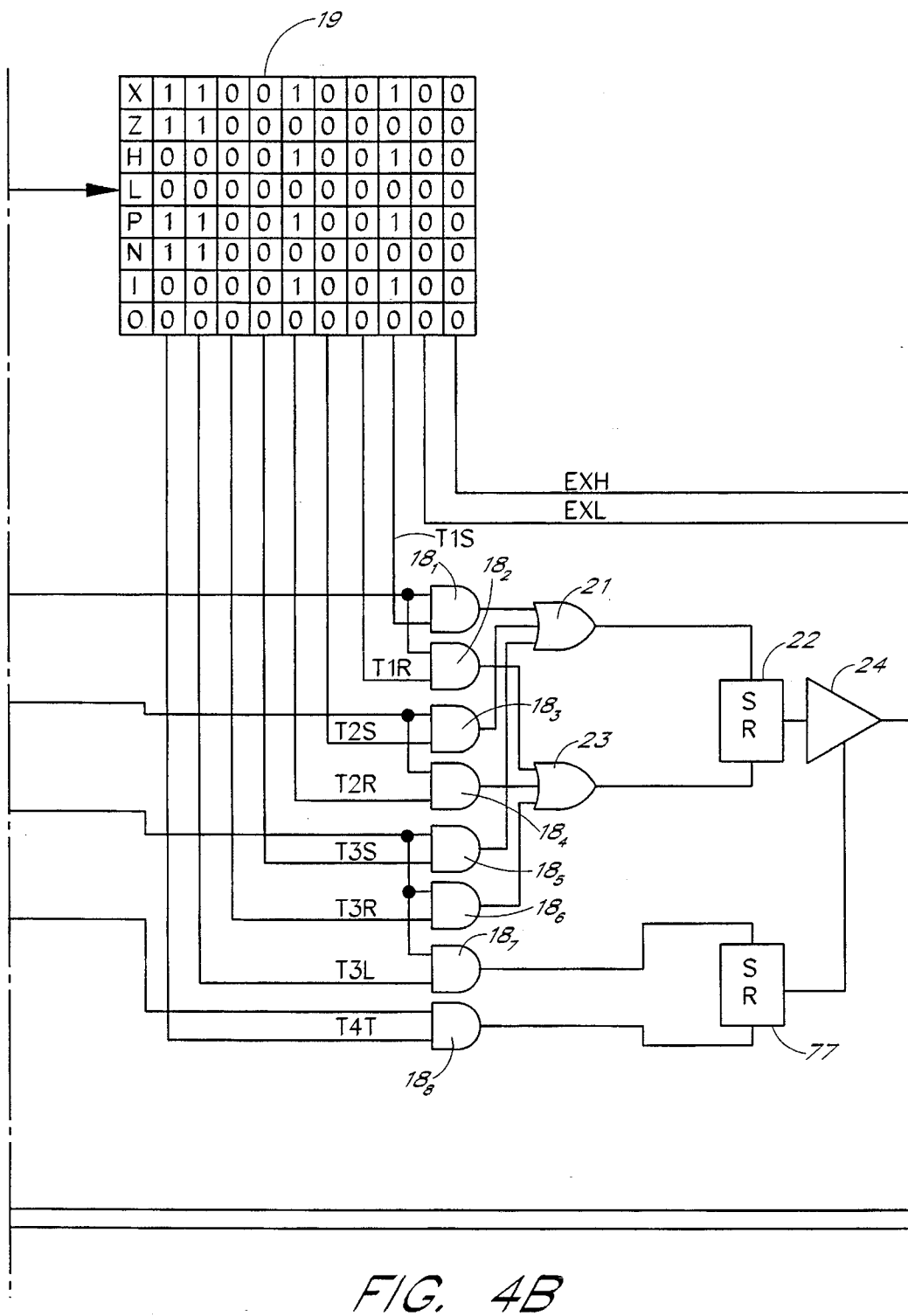
FIG. 4 is a block diagram which shows an example of prior art semiconductor IC tester.
Figure 4C:
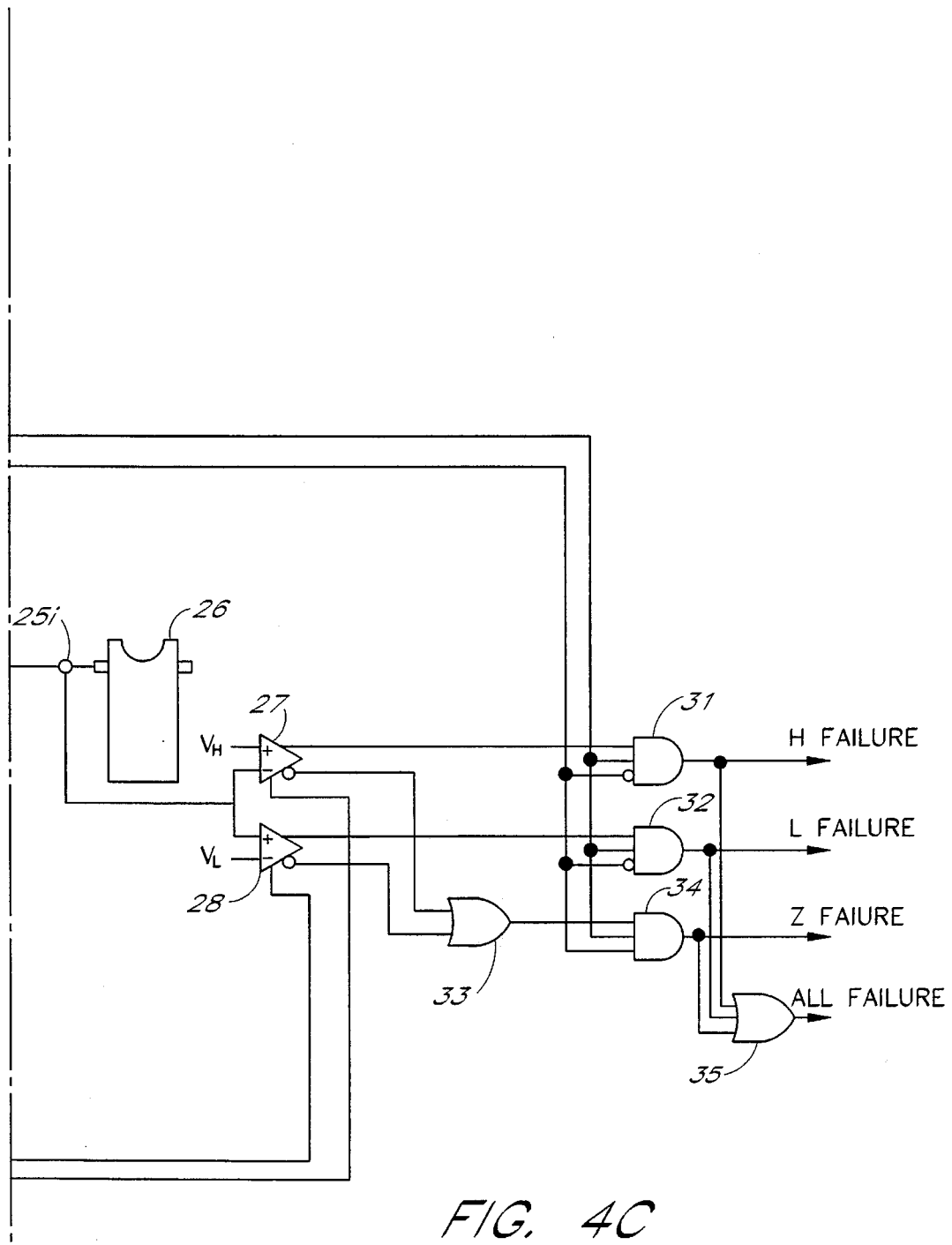
Figure 6:
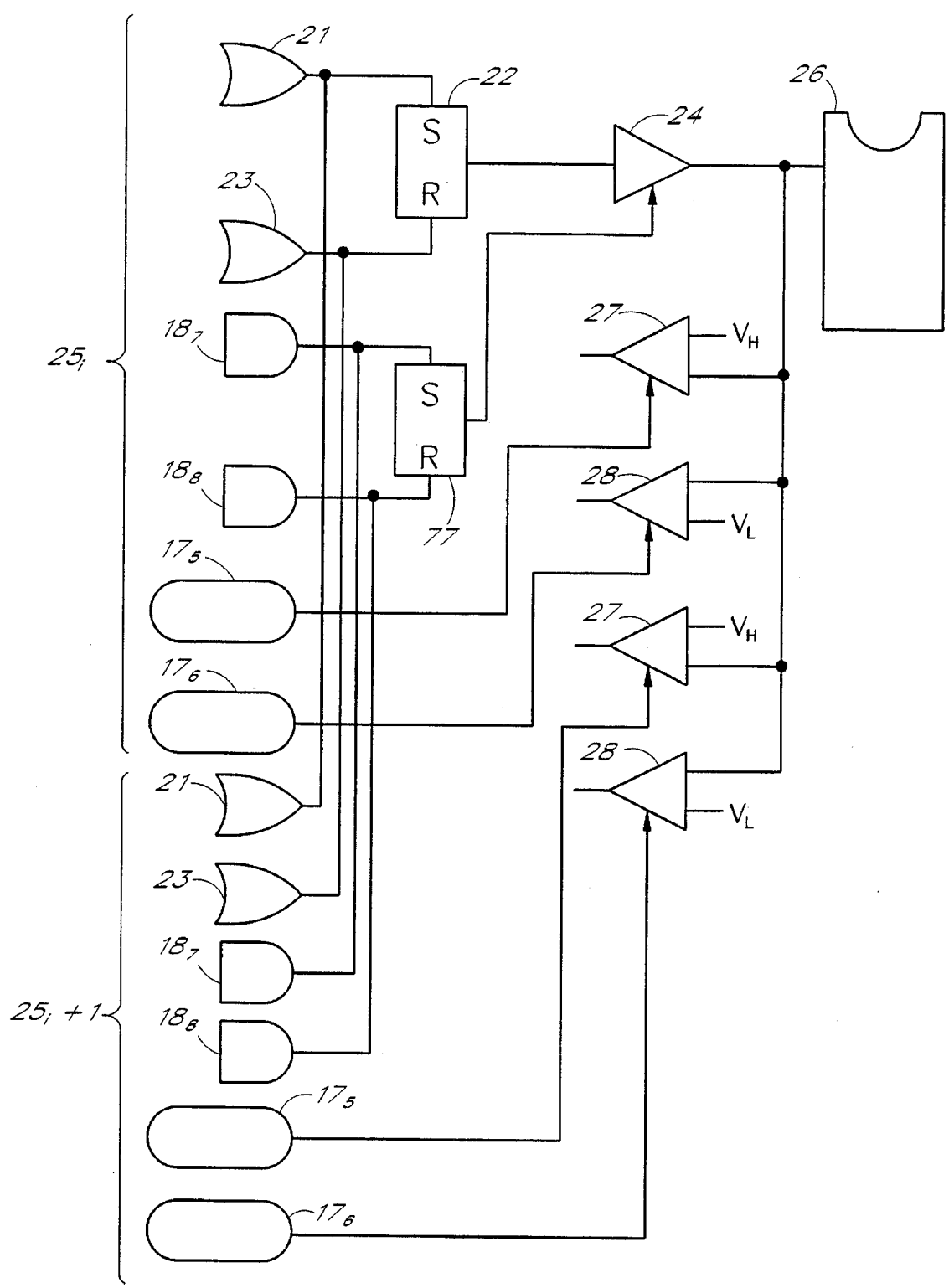
FIG. 6 is a block diagram which shows the circuit connection for the double-speed test in the conventional IC tester.

One of the embodiments of the present invention is shown in FIG. 1, in which like parts corresponding to those in FIG. 4 are identified by the same reference numerals.

In the embodiment of FIG. 1, a double-speed mode signal representing double-speed test is provided to AND circuits 42 and 43 through a terminal 41. The outputs of AND circuits $18_7$ and $18_8$ are also input to the AND circuits 42 and 43, respectively. The outputs of the AND circuit 42 and an OR circuit 21 are supplied to the set terminal S of the first flip-flop 22 via an OR circuit 44. The output of the AND circuit 43 and an OR circuit 23 are supplied to the reset terminal R of the first flip-flop 22 via an OR signal 45.

Moreover, the double-speed mode signal of the terminal 41 and the output of AND circuit $18_7$ are supplied to the set terminal S of the second flip-flop 77 via an OR circuit 46. The reversed signal of the double-speed mode signal is supplied to an AND circuit 47 along with the output of an AND circuit $18_8$, then the output of the AND circuit 47 is supplied to the reset terminal R of the second flip-flop 77.

In a waveform memory 19, the data arranged for the double-speed mode are stored corresponding to various waveforms. For instance, the content of the waveform memory 19 for generating an RZ waveform for double-speed mode are shown in the waveform memory 19 of FIG. 1. Moreover, delay times for delay circuits $17_1$ and $17_2$ are controlled by data from timing memories $15_1$ and $15_2$ so that the clocks are generated from the delay circuit $17_1$ and $17_2$ in the first half of a test cycle. Delay times for delay circuits $17_3$ and $17_4$ are controlled by data from timing memories $15_3$ and $15_4$ so that the clocks are generated from the delay circuit $17_3$ and $17_4$ in the latter half of the test cycle. By using bits PATA and PATB in the pattern data PAT, a waveform in the first half of the test cycle is determined by 1 or 0 of PATA, and a waveform in the latter half of the test cycle is determined by 1 or 0 of PATB.

In the waveform memory 19 shown in FIG. 1, if both PATA and PATB are in the 0 state, the contents in the address "0" in the memory 19 is read. Because the data is all 0, the output of the first flip-flop 22 is maintained low. When PATA is 1 and PATB is 0, the contents in the address "1" of memory 19 is read. Because only T1S and T2R are 1, the first flip-flop 22 is set at the timing T1 of the clock output from the delay circuit $17_1$ and is reset at the timing T2 of the clock output from the delay circuit $17_2$. An RZ waveform which is high between the interval T1 and T2 in the first half of test cycle is output from the first flip-flop 22 as shown in the second cycle of FIG. 2A.

When PATA is 0 and PATB is 1, the content of address "N" is read in which only T3L and T4T are 1. In this case, since the AND circuits 42 and 43 are open because of the double-speed mode signal, the first flip-flop 22 is set at the timing T3 of the clock output from the delay circuit $17_3$ and is reset at the timing T4 of the clock output from the delay circuit $17_4$. Therefore, an RZ waveform which is high between the interval T3 and T4 in the latter half of test cycle is generated by the first flip-flop 22 as shown in the third cycle of FIG. 2A.

When both PATA and PATB is 1, the content in the address "P" of the waveform memory 19 is read in which T1S, T2R, T3L, and T4T are in the 1 level. An RZ waveform which is high between the interval T1 and T2 in the first half of test cycle and high between the interval T3 and T4 in the latter half of test cycle is output from the first flip-flop 22 as shown in the fourth cycle of FIG. 2A.

As in the foregoing, the test waveform signals of two times faster than the test cycle can be generated by setting data of PATA and PATB and the delay time in the delay circuits $17_1$–$17_2$. In the double-speed mode, because the second flip-flop 77 is always set by the double-speed mode signal and is always prohibited to be reset by the inverted double-speed mode signal from the AND circuit 47, the driver 24 is maintained in the state of enable.

Figures 2A, 2B, 2C:
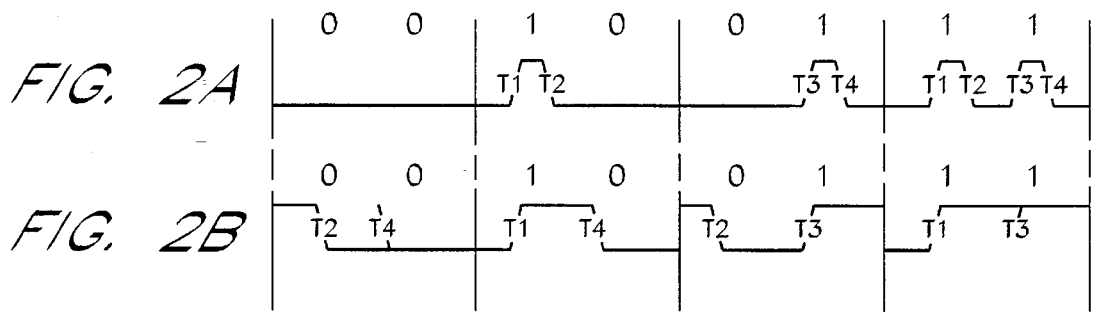
FIG. 2A shows an example of outputs of the flip-flop for drivers for generating an RZ waveform at double-speed mode.
FIG. 2B shows an example of NRZ waveform generated at double-speed mode.
FIG. 2C shows an example of expected data stored in the waveform memory.

In the same way, if the contents of the waveform memory 19 are properly selected, an NRZ waveform of the double-speed can be obtained from the output of the first flip-flop 22 as shown in FIG. 2B.

Test pins connected to the outputs of the device under test 26 are used for comparing the outputs with expected data. In this invention, two inverted outputs of the first and second comparators 27 and 28 are supplied to AND circuits 51 and 52. Two outputs of AND circuits 31 and 51 are supplied to the input terminal B of the first selector 54 via an OR circuit 53. Two outputs of AND circuits 32 and 52 are supplied to the input terminal B of the second selector 57 via an OR circuit 56. Two non-inverted outputs of comparators 27 and 28 are supplied to the input terminals A of selectors 54 and 57 respectively. The outputs of the selectors 54 and 57 are provided to AND circuits 58 and 59. Also, the outputs of the OR circuits 53 and 56 are input to the AND circuits 58 and 59 via an OR circuit 61. Selectors 54 and 57 are controlled by the double-speed mode signal from the terminal 41. In the double-speed mode, the signal provided at the input terminal B is selected at the sector outputs. Other than the double-speed mode, the signal provided at the input terminal A is selected. The outputs of AND circuits 58 and 59 are supplied to AND circuits 62 and 63, respectively. The AND circuits 62 and 63 are also supplied with data CPE1 and CPE2, respectively, read from an algorithmic pattern generator 64. The outputs of AND circuits 62 and 63 are supplied to an OR circuit 35.

In the double-speed mode, threshold voltages $V_H$ and $V_L$ of the comparators 27 and 28 are set in the same value $V_0$. A strobe signal for the comparator 27 is supplied from the delay circuit $17_5$ in the first half of the test cycle. A strobe signal for the comparator 28 is supplied from the delay circuit $17_6$ in the latter half of the test cycle. That is, the comparator 27 is used for comparing the IC device outputs in the first half of the test cycle and the comparator 28 is used for comparing the IC device outputs in the latter half of the test cycle.

In addition to the expected high data EXH and the expected low data EXL as described with reference to FIG. 4, expected non-high data EXHZ and expected non-low data EXLZ are also stored in the waveform memory 19 as expected data corresponding to the inverted outputs of the comparators 27, 28 respectively. "Don't care" is achieved in this example, by using the data CPE1 and CPE2 from the algorithmic pattern generator 64. When CPE1 is 0, the results of comparison from the comparators 27 and 28 are disregarded in the first half of the test cycle. When CPE2 is 0, the results of comparison from the comparators 27 and 28 are disregarded in the latter half of the test cycle. To output the compared results from the AND circuits 62 and 63, CPE1 and/or CPE2 must be 1.

Therefore, each expected data, the data CPE1 and CPE2 are stored in the waveform memory 19 and the algorithmic pattern generator 64 as shown in FIG. 2C. When the expected data in the first half is low L and the expected data in the latter half is don't care X, data EXH is set to 0, EXHZ is set to 1, EXL is set to 1, and CPE1 is set to 1 CPE2 is set to 0 in the address L of the waveform memory 19 and the algorithmic pattern generator 64. When the expected data in the first half is don't care X and the expected data in the latter half is low L, the data EXHZ, EXL, and CPE2 are set to 1 and the rest of the data are set to 0 in the address L. When the expected data in the first half is low L and the expected data in the latter half is also low L, the data EXHZ, EXL, CPE1, and CPE2 are set to 1 and the rest of the data are set to 0 in the address L.

When the expected data in the first half is high H and the expected data in the latter half is don't care X, the data EXH, EXLZ, and CPE1 are set to 1 and the rest of the data are set to 0 in the address H of the waveform memory 19 and the algorithmic pattern generator 64. When the expected data in the first half is don't care X and the expected data in the latter half is high H, the data EXH, EXLZ, and CPE2 are set to 1 and the rest of the data are set to 0 in the address H. When the expected data in the first half is high H and the expected data in the latter half is also high H, data EXH, EXLZ, CPE1, and CPE2 are set to 1 and the rest of the data are set to 0 in the address H.

When the expected data in the first half is low L and the expected data in the latter half is high H, the data EXHZ, EXLZ, CPE1, and CPE2 are set to 1 and the rest of the data is set to 0 in the address Z of the waveform memory 19 and the algorithmic pattern generator 64. When the expected data in the first half is high H and the expected data in the latter half is low L, the data EXH, EXL, CPE1 and CPE2 are set to 1 and the rest of the data is set to 0 in the address X of the waveform memory 19 and the algorithmic pattern generator 64.

The threshold voltages are set to $V_H = V_L = V_0$ in the double-speed mode as mentioned above. When the expected data in the first half is high and the output V of the device under test 26 is smaller than $V_0$, the non-inverted output of the comparator 27 becomes high and the output of the AND circuit 31 becomes high. When the expected data in the first half is low and the output V of the device under test 26 is larger than $V_0$, the inverted output of the comparator 27 becomes high and the output of the AND circuit 51 becomes high. When the expected data in the latter half is low and the output V of the device under test 26 is larger than $V_0$, the non-inverted output of the comparator 28 becomes high and the output of the AND circuit 32 becomes high. That is, if failure is happened, at least one of the outputs of the AND circuits 31, 32, 51 and 52 becomes high. Thus, the AND circuits 58 and 59 are set to open and the outputs of selectors 54 and 57 pass therethrough. The output of the AND circuit 62 becomes high when failure is happened in the first half of the test cycle, while the output of the AND circuit 63 becomes high when failure is happened in the latter half, and each test result of the first half and the latter half of one test cycle can be output.

In the example of FIG. 1, six timing clocks, that is, the outputs of delay circuits $17_1$–$17_6$, are used. In the normal-speed mode (one test pattern per one test cycle), there must be at least five timing clocks to an I/O pin of the device under test. Such timing clocks are, set and reset timing clocks to the first flip-flop 22, set and reset timing clocks to the second flip-flop 77, and a strobe clock to the comparators 27 and 28. In most of the cases, the double-speed mode testing is not applied to an I/O pin, but applied only a separate input pin or an output pin of the device under test. In such a situation, there need four timing clocks which includes two sets of set and reset timing clocks of the first flip-flop 22 for the output pin and only two timing clocks which are strobe clocks to each comparator 27 and 28 for the input pin. Therefore, one of the delay circuits in Figure may be unnecessary in most of the double-speed mode testing.

Figures 3, 3A:
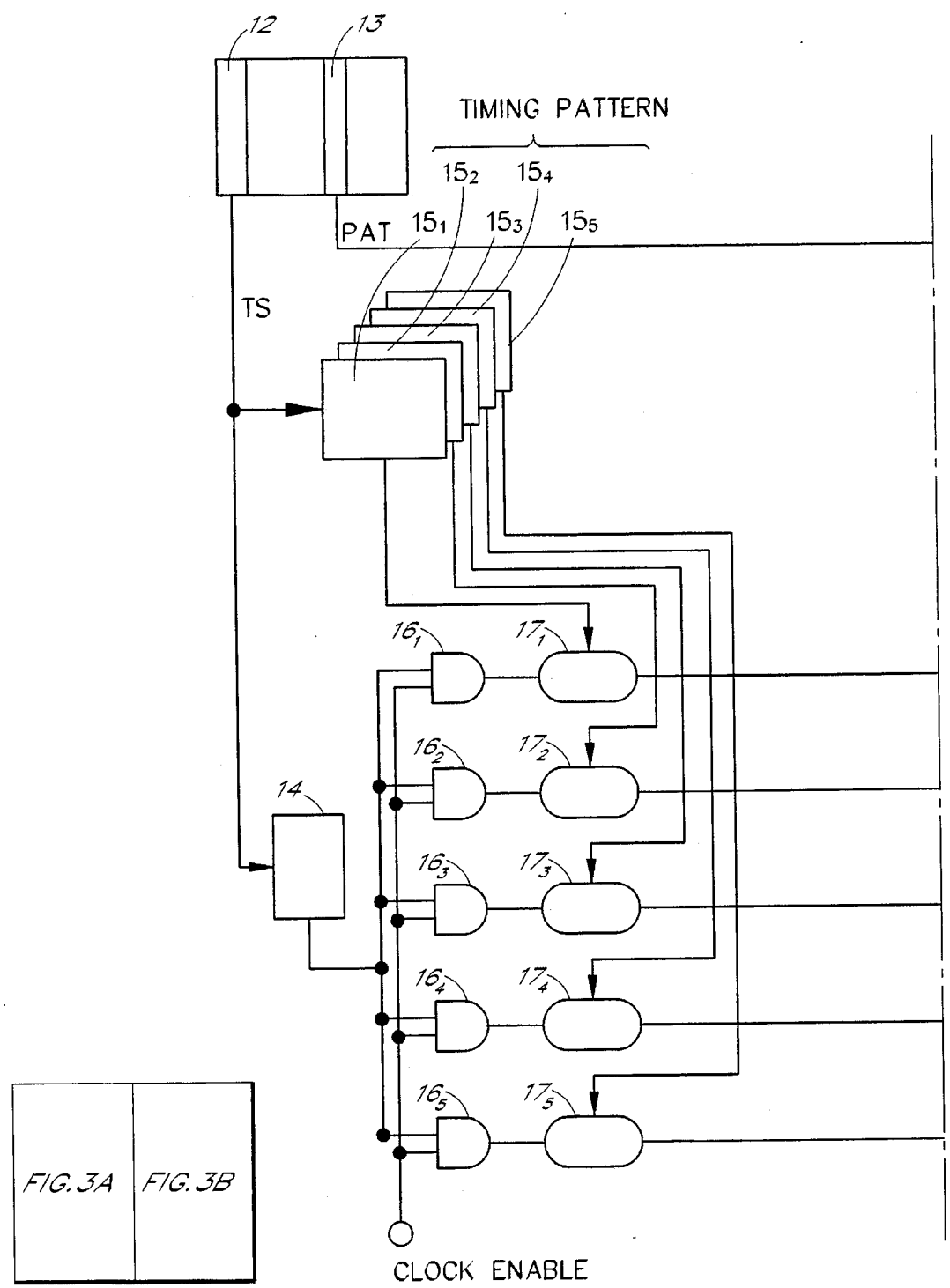
FIG. 3 is a block diagram which shows a principal part of another embodiment of the present invention.
Figure 3B:
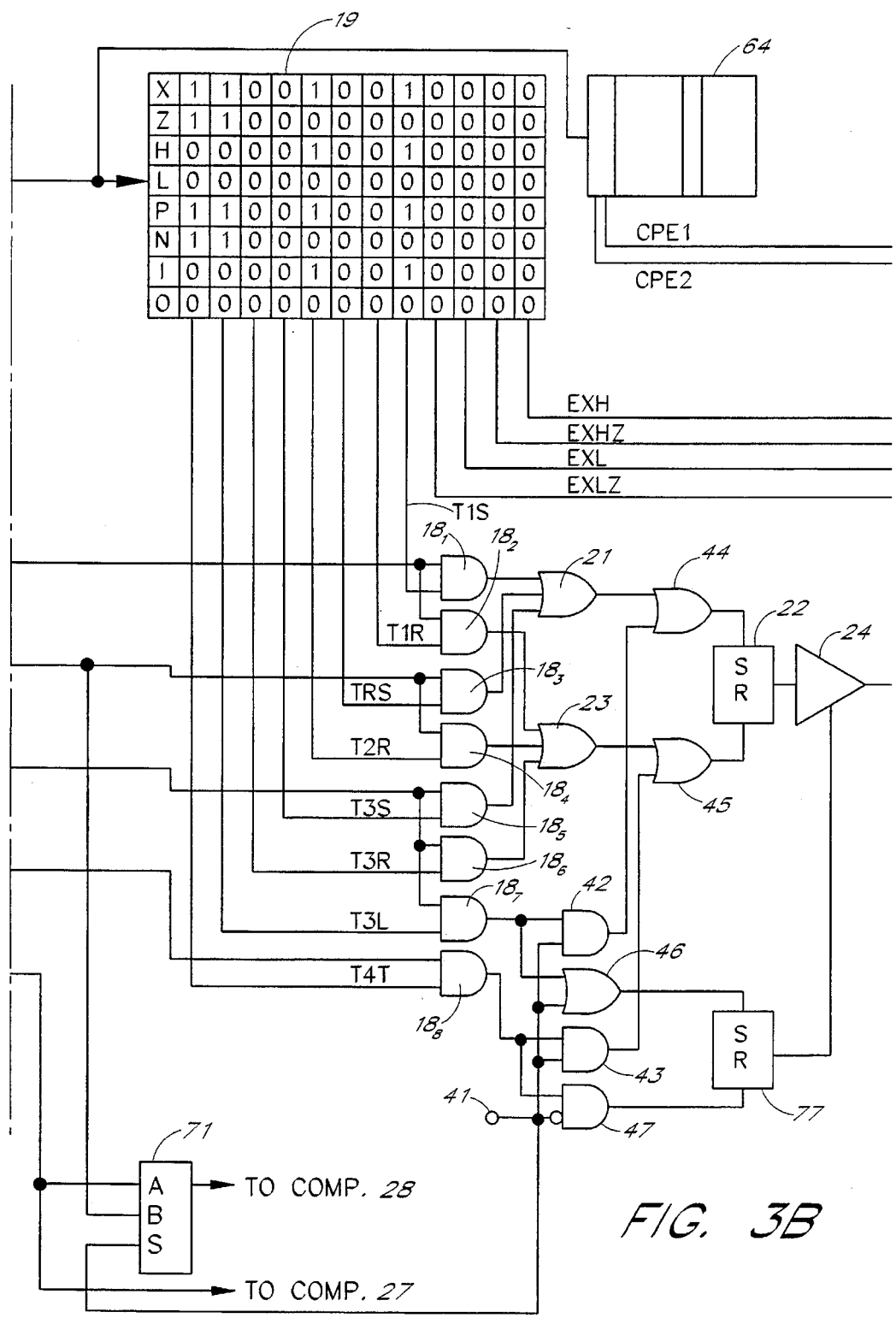

FIG. 3 shows a block diagram for utilizing five delay circuits $17_1$–$17_5$ for generating timing clocks for the double-speed mode, in which like parts corresponding to those in FIG. 1 are identified by the same reference numerals. In the double-speed mode with output-only pins, timing clocks generated by the outputs of delay circuits $17_1$–$17_4$ are used in the same manner as in the case of FIG. 1.

In the double-speed mode with input-only pins, the output of the delay circuit $17_5$ is supplied as a strobe clock to the comparator 27 and one of the outputs of delay circuits $17_1$–$17_4$ is supplied as a strobe clock to the comparator 28 via the selector 71. In the example of FIG. 3, the output of the delay circuit $17_2$ is used as a strobe clock. In the normal-speed mode, the selector 71 outputs the signal supplied at its input terminal A and the output of the delay circuit 175 is supplied to the comparators 27 and 28 as a strobe clock.

According to the invention as described above, because the timing signals to control drivers enable and disable are used to set drivers in high and low levels, tests can be performed by the speed of two times in the highest test speed of IC tester and all test pins can be effectively used. In almost all the cases, high-speed semiconductor IC devices do not have I/O pins. Because the high-speed semiconductor IC devices have output-only pins and input-only pins, the double-speed test can be performed without controlling drivers enable and disable, as described above.

What is claimed is:

1. A semiconductor IC tester for testing an IC device by applying a test signal to the IC device and comparing a resulted output signal from the IC device with expected data for each test cycle, comprising:

a pattern generator to generate pattern data to form said test signal and said expected data, timings of said test signal being formed based on a first group of clock signals and a second group of clock signals;

a driver to directly supply said test signal to an IC device under test as a driver output signal when receiving said test signal as a driver input signal;

a first flip-flop to provide said driver input signal to said driver based on the timings determined by said first group of clock signals;

a second flip-flop to set an enable state or a disable state of said driver based on the timings determined by said second group of clock signals;

a comparator to compare an output signal from said IC device under test with a threshold voltage level;

a selector circuit to selectively transfer output signals from said comparator to compare with said expected data at a rate two times higher than said test cycle when said IC tester is in a double-speed mode; and a double-speed switching circuit to supply said second group of clock signals to said first flip-flop so that said test signal is generated at a rate two times higher than said test cycle while controlling said second flip-flop to maintain said driver in said enable state when said IC tester is set in said double-speed mode.

2. A semiconductor IC tester as defined in claim 1, wherein said pattern generator accesses a waveform memory by said pattern data, said waveform memory stores waveform data for forming waveforms of said test signal with the timings determined by said first and second group of clock signals.

3. A semiconductor IC tester as defined in claim 1, wherein said pattern generator accesses a timing memory, said timing memory stores delay time data for forming timings of said first and second group of clock signals by controlling a plurality of delay circuits.

4. A semiconductor IC tester as defined in claim 1, wherein said first flip-flop and said second flip-flop are set-reset flop-flops wherein set and reset signals from said first flop-flop determines high and low states of said test signal and set and reset signals from said second flip-flop determines said enable or disable states of said driver.

5. A semiconductor IC tester as defined in claim 1, wherein said first group of clock signal is comprised of a first clock signal and a second clock signal, and said second group of clock signals is comprised of a third clock signal and a fourth clock signal.

6. A semiconductor IC tester as defined in claim 1, wherein said IC tester further includes a third group of clock signals to be used to generate strobe signals, said strobe signals are provided to said comparator for sampling said output signal from said IC device under test and hold said sampled signal for a predetermined period of time to be compared with said expected data, the timings of said strobe signals are determined by timing data provided by said pattern generator.

7. A semiconductor IC tester as defined in claim 1, wherein said comparator is comprised of a first comparator provided with a high threshold voltage level to detect a high level of said output signal from said IC device under test and a second comparator provided with a low threshold voltage level to detect a low level of said output signal from said IC device under test.

8. A semiconductor IC tester as defined in claim 6, wherein said selector circuit is comprised of a first selector circuit corresponding to said first comparator and a second selector circuit corresponding to said second comparator.

9. A semiconductor IC tester as defined in claim 8, wherein each of said first and second comparators has an inverted output and a non-inverted output, said inverted output and said non-inverted output are selected by said selector to be compared with said expected data.

10. A semiconductor IC tester for testing an IC device by applying a test signal to the IC device and comparing a resulted output signal from the IC device with expected data for each test cycle, comprising:

pattern generating means for generating pattern data to form said test signal and said expected data, timings of said test signal being formed based on a first group of clock signals and a second group of clock signals;

a driver for directly supplying said test signal to an IC device under test as a driver output signal when receiving said test signal as a driver input signal;

input means for providing said driver input signal to said driver based on the timings determined by said first group of clock signals;

control means for setting an enable state or a disable state of said driver based on the timings determined by said second group of clock signals;

a comparator for comparing an output signal from said IC device under test with a threshold voltage level;

selector means for selectively transferring output signals from said comparator to compare with said expected data at a rate two times higher than said test cycle when a double-speed mode signal is provided thereto; and switching means for supplying said second group of clock signals to said first flip-flop so that said test signal is generated at a rate two times higher than said test cycle while controlling said second flip-flop to maintain said driver in said enable state when said double-speed mode signal is provided thereto.

* * * * *